US006703668B1

United States Patent
Lin et al.

(10) Patent No.: US 6,703,668 B1
(45) Date of Patent: Mar. 9, 2004

(54) LOCAL INTERCONNECT FORMED USING SILICON SPACER

(75) Inventors: Xi-Wei Lin, Fremont, CA (US); Emmanuel de Muizon, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/588,799

(22) Filed: Jun. 6, 2000

Related U.S. Application Data

(62) Division of application No. 09/239,458, filed on Jan. 28, 1999, now Pat. No. 6,150,266.

(51) Int. Cl.⁷ .............................................. H01L 31/062
(52) U.S. Cl. ........................ 257/377; 257/754; 257/768
(58) Field of Search .................................. 257/377, 382, 257/384, 413, 741, 754, 755, 757, 764, 768, 770, 769, 758, 900, 410, 411, 412

(56) References Cited

U.S. PATENT DOCUMENTS

| 5,290,720 A | * | 3/1994 | Chen ........................... 437/41 |
| 5,483,104 A | * | 1/1996 | Godinho et al. ............. 257/758 |
| 5,614,747 A | * | 3/1997 | Ahn et al. .................... 257/316 |
| 6,255,701 B1 | * | 7/2001 | Shimada ....................... 257/384 |

\* cited by examiner

*Primary Examiner*—Wael Fahmy
*Assistant Examiner*—Ginette Peralta
(74) *Attorney, Agent, or Firm*—Peter Zawilski

(57) ABSTRACT

A local interconnect structure that includes a silicon spacer. After deposition of polysilicon gates and formation of spacers on a semiconductor substrate, photolithography and oxide etch steps are performed to remove a portion of a spacer along a segment of the gate where local interconnection is to be formed. A thin screen oxide layer is deposited over the wafer, followed by the formation of diffusion regions. A silicon layer (either amorphous or polycrystalline) is then deposited. The silicon layer is then selectively etched so as to form a silicon spacer along the segment of the gate where local interconnection is to be formed. A conventional SALICIDE process is performed, leading to simultaneous silicidation of the diffusion region, the gate, and the silicon spacer. The resulting local interconnect electrically connects the gate and the diffusion region.

12 Claims, 11 Drawing Sheets

LOCAL INTERCONNECT FORMED USING SILICON SPACER

This is a divisional of application(s) Ser. No. 09/239,458 filed on Jan. 28, 1999 now U.S. Pat. No. 6,150,266.

TECHNICAL FIELD

The present claimed invention relates to the field of semiconductor devices. More specifically, the present claimed invention relates to a local interconnect for a semiconductor device.

BACKGROUND ART

As the demand for high performance, high density integrated circuit devices increases, the ability to offer ever smaller Static Random Access Memory (SRAM) cells becomes critical. As the device feature size shrinks, the SRAM cell size becomes interconnect limited. One way to minimize the cell size is to use local interconnects (instead of metal 1 and contacts) to strap gates and diffusion areas.

In one recent prior art method for forming local interconnects, dielectric spacers are formed on each side of each gate. A portion of an dielectric spacer is removed using mask and etch steps so as to form a exposed region on the side of the gate. Self-aligned silicidation (SALICIDE) is used to form an interconnect structure that electrically connects the gate to the diffusion area.

Prior art FIG. 1A shows a diagram of a local interconnect formed according to a prior art process. Silicide region 3 extends over the top of polysilicon gate 2 and silicide region 4 extends over silicon substrate 1 such that it at least partially overlies diffusion region 5. However, the sidewall of the polysilicon gate 2 does not form a continuous layer of silicide. The poor sidewall silicidation is primarily due to metal thinning associated with sputtering shadowing and to residual surface oxide left over from prior processing steps (polysilicon reoxidation, spacer removal, etc.). Thus, the gate-to-diffusion connection relies on the silicide at the bottom corner 10 where the sidewall of polysilicon gate 2 meets silicide region 4. The resulting electrical connection is unreliable as it relies on electrical connection via the tip of silicide region 4 at bottom corner 10 and relies on conductivity through polysilicon gate 2.

In structures that use Shallow Trench Isolation (STI) for isolating diffusion areas, dielectric material is disposed in shallow trenches. When the polysilicon gate does not overlie the diffusion area, disconnection results. Prior art FIG. 1B shows a disconnection 20 that results from the placement of polysilicon gate 2 over STI dielectric 21. Disconnection problems of this type typically result from photolithography misalignment.

Another problem with prior art local interconnects is junction leakage. Junction leakage typically occurs as a result of rough silicide formation because the diffusion junction is abruptly delineated along the gate edge, creating a junction punch-through (a conductive path into the semiconductor substrate). This is in contrast to the normal situation where the source/drain extension along a spacer edge provides extra protection against silicidation induced junction leakage. FIG. 1C shows junction punch-through 30 that is a conductive path resulting from rough silicide formation during the formation of silicide region 4.

Thus, a need exists for a local interconnect and a method for forming a local interconnect that produces a local interconnect that is robust and that makes good electrical connection. Also, a local interconnect and a method for making a local interconnect is required that meets the above need and that does not have silicidation induced junction leakage. The present invention provides a solution to the above needs.

DISCLOSURE OF THE INVENTION

The present invention provides a local interconnect structure that includes a silicon spacer. The local interconnect of the present invention is more robust than prior art interconnect structures.

First, gates and spacers are formed on a silicon substrate using conventional fabrication processes. In one embodiment, polysilicon is deposited, masked and etched to form gates. Spacers are then formed by the deposition of a dielectric layer that is etched to form spacers on opposite sides of each gate.

A portion of a spacer is removed so as to form an open region (exposing a portion of the sidewall of the spacer) where local interconnection is to be formed. A thin screen oxide is deposited over the wafer, followed by formation of a diffusion region. In one embodiment, implantation and rapid-thermal annealing are used to form a diffusion region that includes source/drain structures. A layer of silicon (either amorphous or polycrystalline) is then deposited, followed by selective silicon etching to form a silicon spacer along the open region.

A conventional self-aligned silicidation (SALICIDE) process is performed, leading to simultaneous silicidation on diffusion, gate, and along the silicon spacer, forming a local interconnect between the gate and the diffusion.

The local interconnects of the present invention are more robust and reliable than prior art local interconnects. This is primarily due to the fact that the metal thickness, hence silicide thickness, along the silicon spacer is close to that on the gate and on the diffusion region. More particularly, because the silicide surface in the present invention is raised above the original silicon surface, the outward expansion of silicide will result in a continuous silicide layer formation at the local interconnect. Second, since the metal thickness around the intersection between the silicon spacer and the diffusion region is significantly thicker (approximately 300 Angstroms) than the oxide, there is plenty of metal supply for silicide formation, thus enhancing the formation of a continuous silicide at those interface points. This results in silicide that is reliable at the joint points between the silicon spacer and the diffusion region and between the silicon spacer and the gate.

In structures that use Shallow Trench Isolation (STI) for isolating diffusion areas, a good electrical connection results even when the gate does not overlie the diffusion area. Thus, the local interconnect and method for forming a local interconnect of the present invention does not result in disconnection, as typically occurs in prior art processes from photolithography misalignment.

Silicidation on the silicon substrate occurs over source/drain regions where the junction is relatively deep. Therefore, rough silicide formation does not result in junction punch-through as occurs in prior art processes. Thus, the local interconnect structure and method of the present invention does not produce junction leakage as occurs in prior art methods.

Thus, the present invention provides a local interconnect structure and a method for forming a local interconnect structure that produces a local interconnect that is robust and that makes good electrical connection. Also the local interconnect structure and the method for making a local interconnect structure of the present invention does not have silicidation induced junction leakage.

These and other objects and advantages of the present invention will no doubt become obvious to those of ordinary skill in the art after having read the following detailed description of the preferred embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

Prior Art

Prior Art

Prior Art FIG. 1C is a cross-sectional view illustrating a prior art local interconnect having junction punch-through.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1A:
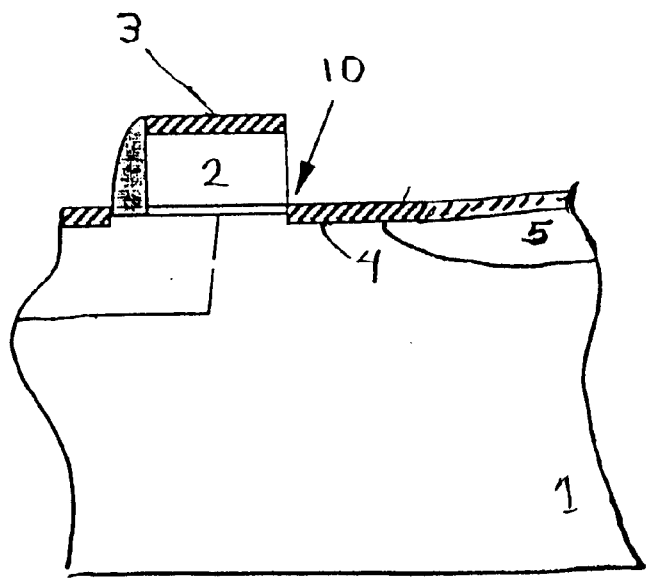
FIG. 1A is a cross-sectional view illustrating a prior art process for forming a local interconnect.
Figure 1B:
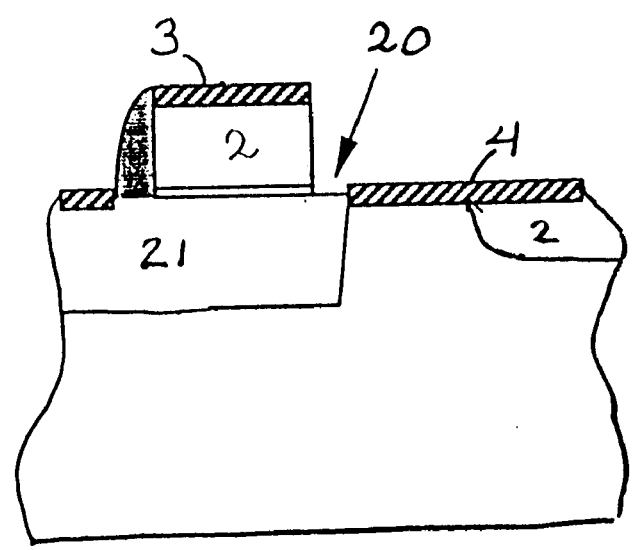
FIG. 1B is a cross-sectional view illustrating a prior art interconnect having a disconnect.
Figure 1C:
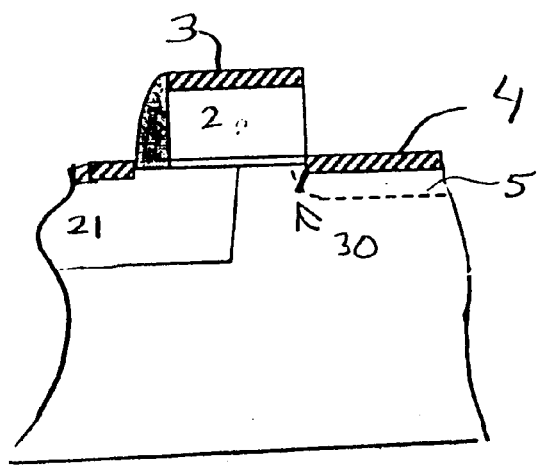
Figure 2:
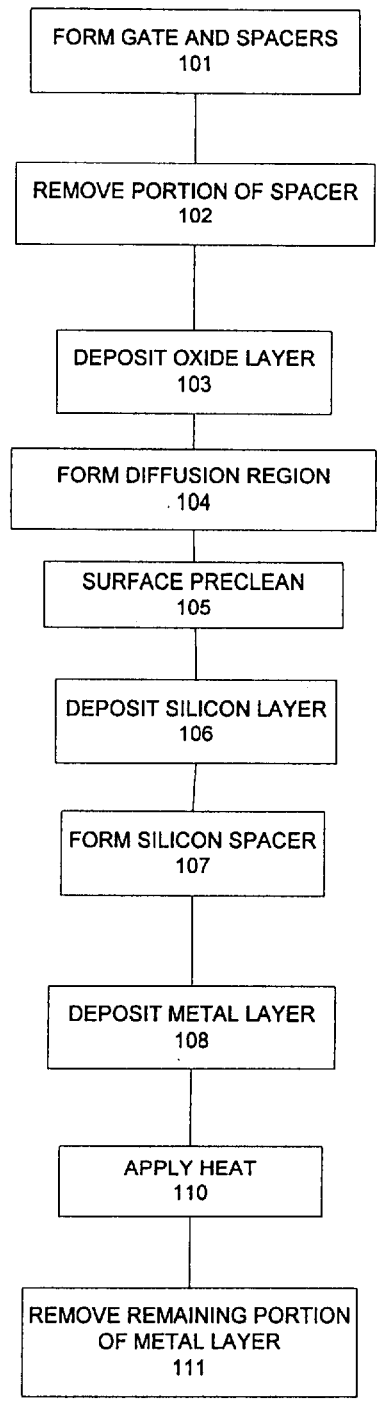
FIG. 2 is a flow chart showing steps for forming a local interconnect in accordance with the present claimed invention.
Figure 3:
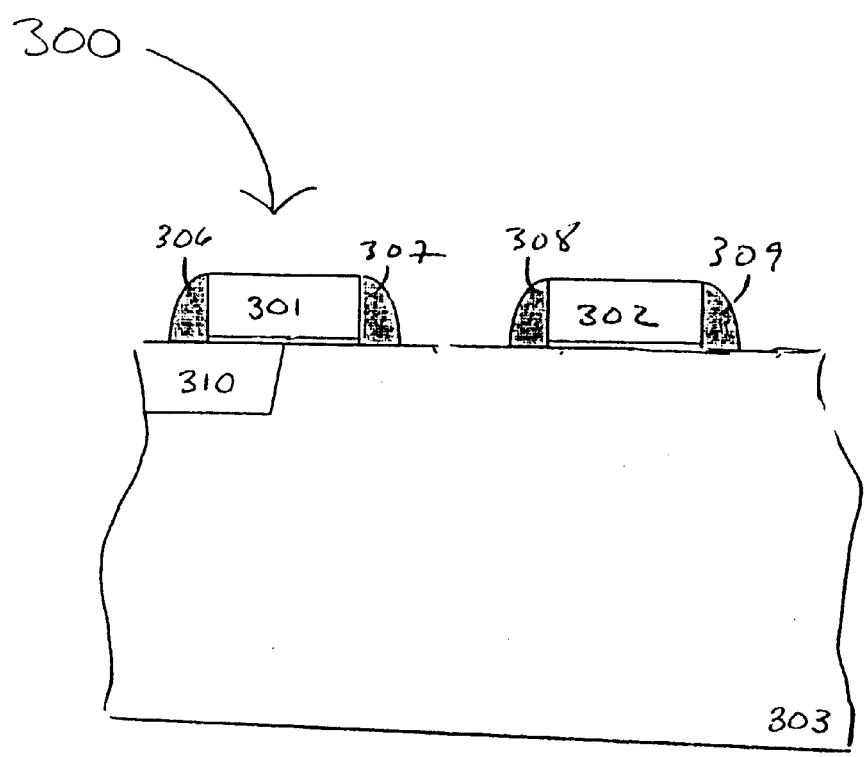
FIG. 3 is a cross-sectional view illustrating a semiconductor substrate having gates and spacers formed thereon in accordance with the present claimed invention.

Referring now to FIG. 2, a gate and spacers are formed on a semiconductor substrate as shown by step 101. In one embodiment, a polysilicon gate is formed having spacers on both sides thereof. Referring now to FIG. 3, structure 300 includes gate 301 and gate 302 that are formed on substrate 303. In one embodiment, gates 301–302 are formed of polysilicon and have a thickness in the range of 1500–3000 Angstroms. Spacers 306–307 extend on opposite sides of gate 301 and spacers 308–309 extend on opposite sides of gate 302. In one embodiment, spacers 306–309 are formed of Tetra Ethyl Ortho Silicate (TEOS) based silicon oxide. In one embodiment, structure 300 includes shallow trench isolation (STI) that isolates active areas using shallow trenches that are filled with dielectric such as trench 310.

Figure 4:
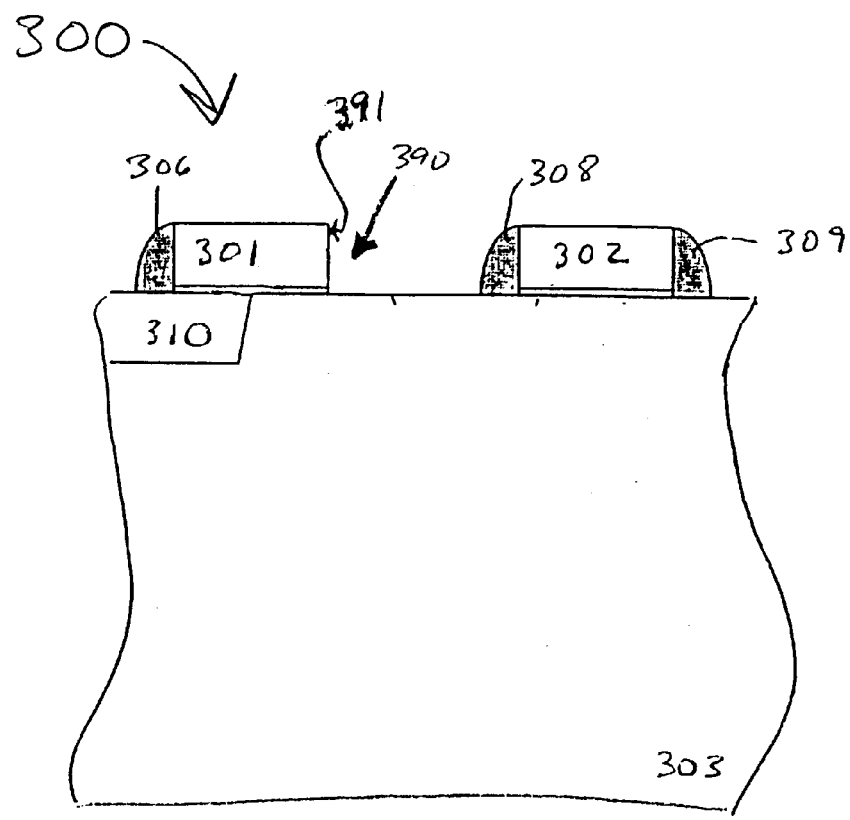
FIG. 4 is a cross-sectional view illustrating the structure of FIG. 3 after the removal of a portion of a spacer in accordance with the present claimed invention.

Referring now to step 102 of FIG. 2, a portion of a spacer is removed so as to form an open region where the local interconnection is to be formed. In one embodiment, spacer removal is performed using a conventional photolithography process followed by an oxide etch step. That is, conventional photolithography techniques are used to selectively mask the structure 300. An etch step is then performed so as to remove the desired portion of the spacer. Referring now to FIG. 4, structure 300 is shown after a portion of spacer 307 (shown in FIG. 3) has been removed, leaving an open region 390 of gate 301 that exposes a portion of sidewall 391 of spacer 307.

Figure 5:
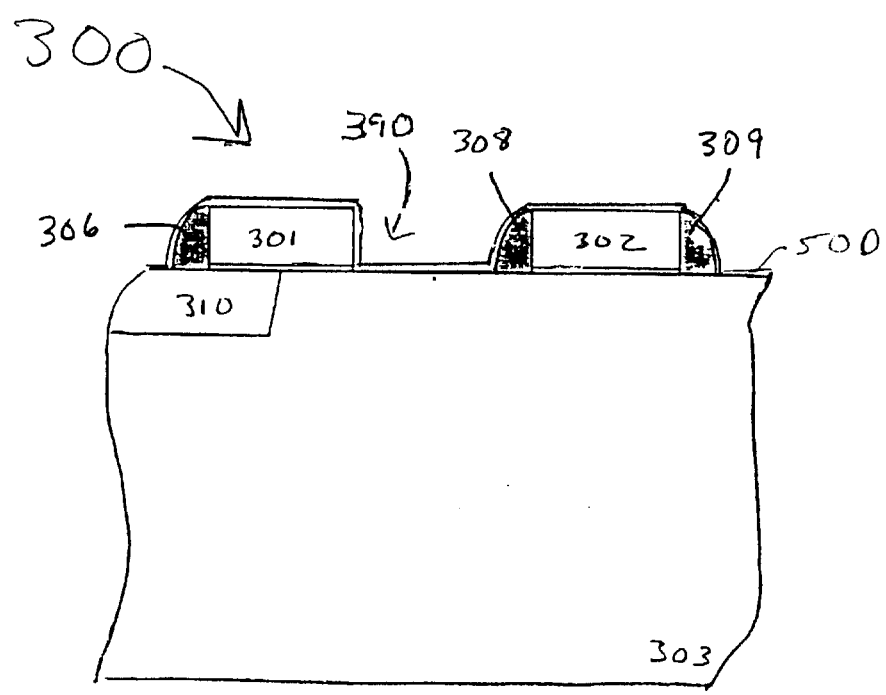
FIG. 5 is a cross-sectional view illustrating the deposition of an oxide layer over the structure shown in FIG. 4 in accordance with the present claimed invention.

As shown by step 103 of FIG. 2, an oxide layer is deposited. In one embodiment, the oxide layer is a thin layer of TEOS-based oxide which is deposited using a Chemical Vapor Deposition (CVD) process. FIG. 5 shows oxide layer 500 to extend over the surface of structure 300. In one embodiment, oxide layer 500 has a thickness of approximately 200 Angstroms. Oxide layer 500 overlies substrate 303 and covers the top surface of gates 301–302. Oxide layer 500 overlies spacers 306, 308–309 and the remaining portions of spacer 307 (not shown). Oxide layer 500 is deposited within the open region 390 shown in FIG. 4, covering the exposed portion of sidewall 391 and overlying that portion of substrate 303 that lies within open region 390. Oxide layer 500 functions as a screen oxide layer during subsequent process steps for forming diffusion regions (e.g. source/drain implantation and rapid thermal annealing steps).

Figure 6:
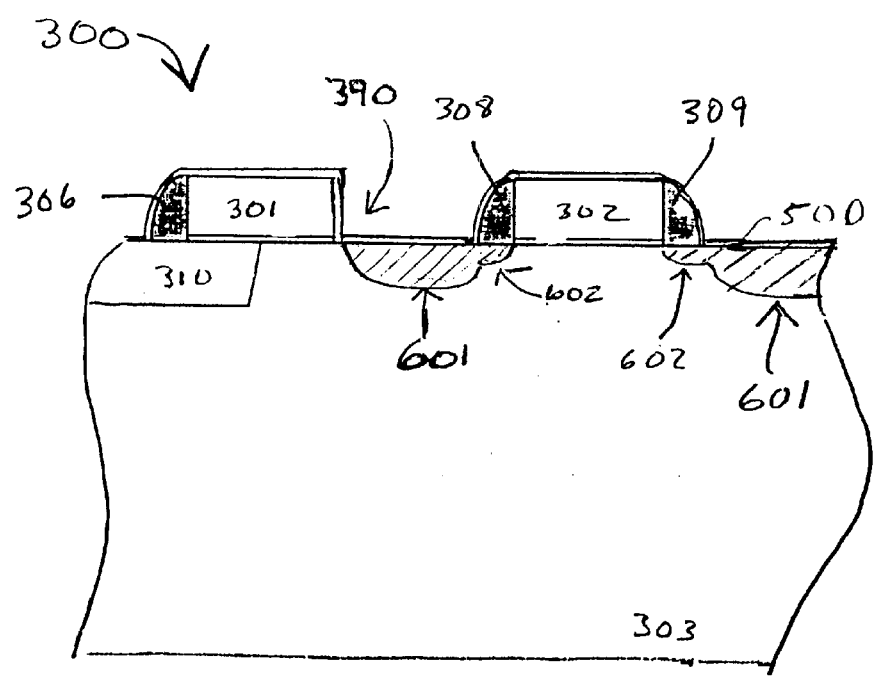
FIG. 6 is a cross-sectional view illustrating the formation of a diffusion region in accordance with the present claimed invention.

Diffusion regions are then formed in the semiconductor substrate as shown by step 104 of FIG. 2. In one embodiment, diffusion regions are formed using conventional source/drain implantation steps and rapid-thermal annealing steps. By the end of process steps for forming diffusion regions, the screen oxide thickness is somewhat reduced due to wet cleaning steps. FIG. 6 shows the structure of FIG. 5 after source/drain implantation steps and rapid-thermal annealing steps have formed diffusion regions 601 and source/drain extension regions 602.

In one embodiment, a surface preclean is then performed as shown by step 105. This step further reduces the thickness of the screen oxide layer. With reference now to FIGS. 5–6, this step results in the reduction of thickness of screen oxide layer 500. Typically, the thickness of oxide layer 500 is reduced to about 30–50 Angstroms.

Figure 7:
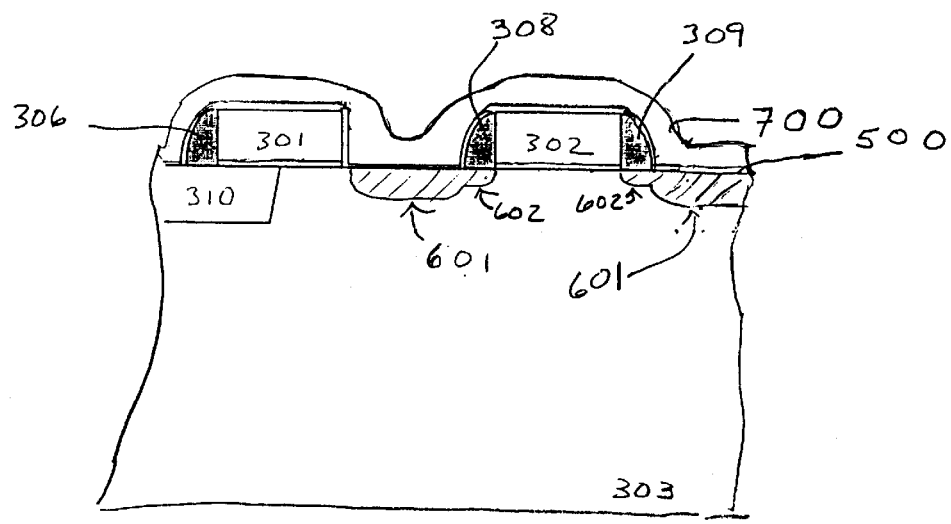
FIG. 7 is a cross-sectional view illustrating the deposition of a layer of silicon in accordance with the present claimed invention.

A silicon layer is then deposited as shown by step 106 of FIG. 2. This silicon layer can be either amorphous or polycrystalline silicon. FIG. 7 shows the structure of FIG. 6 after the deposition of silicon layer 700. In one embodiment, silicon layer 700 has a thickness of approximately 1500–3000 Angstroms.

Figure 8:
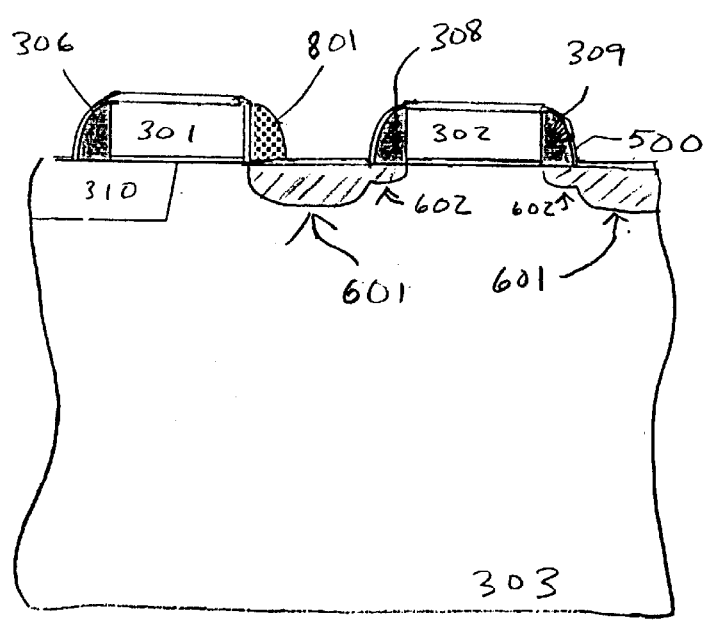
FIG. 8 is a cross-sectional view illustrating the formation of a silicon spacer in accordance with the present claimed invention.

A silicon spacer is then formed as shown by step 107 of FIG. 2. In one embodiment, the silicon spacer is formed by the selective removal of portions of the silicon layer. In one embodiment, an anisotropic plasma etch is performed straight down towards the silicon substrate. The underlying oxide layer operates as an etch stop, allowing for over-etch. FIG. 8 shows the structure of FIG. 7 after mask and etch steps have formed spacer 801. Silicon spacer 801 fills open region 390 of FIGS. 4–6 and covers the exposed portions of sidewall 391.

A silicidation process is then performed so as to form silicide regions that form a local interconnect. In one embodiment, the silicidation process is a conventional SALICIDE process as is illustrated by steps 108–111 of FIG. 2. That is, first, a layer of metal is deposited as is shown by step 108 of FIG. 2. In one embodiment, titanium is deposited to a thickness of between 50 Angstroms and 500 Angstroms using a Physical Vapor Deposition (PVD) process. Alternatively, other metals, such as, for example, Cobalt, Nickel, Platinum, etc. can be used.

As shown by step 110, heat is then applied so as to diffuse the metal into the underlying polysilicon and silicon substrate. As shown by step 111, the remaining metal is then removed. In one embodiment, the metal removal process is accomplished using a sulfuric acid and peroxide etch.

Figure 9:
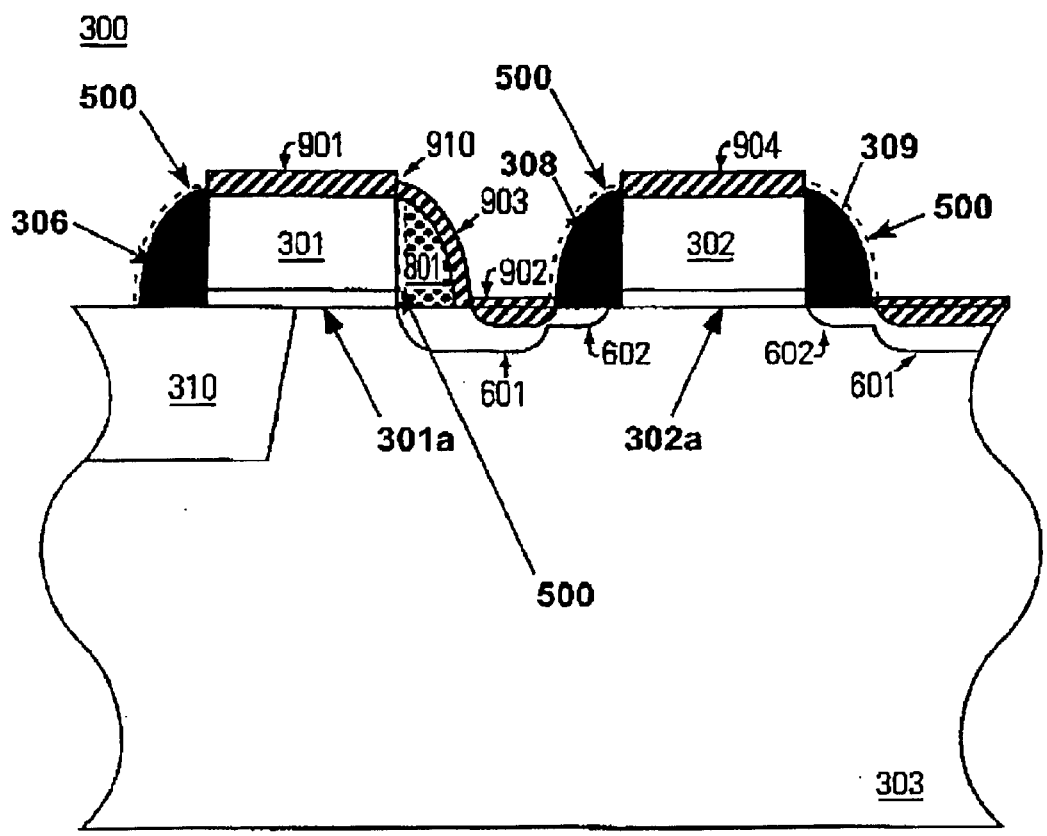
FIG. 9 is a cross-sectional view illustrating the formation of a silicide region in accordance with the present claimed invention.

In one embodiment, the SALICIDE process leads to simultaneous silicidation on the diffusion region, gates, and along the silicon spacer, making a local interconnect between the gate and the diffusion region. Referring now to FIG. 9, in one embodiment, the SALICIDE process forms local interconnect 910 that includes a continuous silicide region. This continuous silicide region includes silicide region 901 that is formed within gate 301, silicide region 902 formed within semiconductor substrate 303, and silicide region 903 that extends within silicon spacer 801. The SALICIDE process also forms silicide region 904 within gate 302. Silicide region 902 extends within diffusion region 601 such that silicide regions 901–903 form a continuous silicide region that electrically connects gate 301 to diffusion region 601. Note that the silicon gate regions 301 and 302 are disposed on oxide regions 301a and 302a respectively. Also spacers 306, 308, and 307 remain in the final structure. As mentioned in the discussion of FIG. 5 and subsequent steps 105 through 108 (as outlined in FIG. 2), the reduction of the screen oxide layer 500 is reduced to about 30–50 Angstroms.

Continuing with FIG. 9, the thickness of silicide region 903 is close to the thickness of suicide regions 901–902. This is primarily due to the fact that the metal thickness, hence silicide thickness, along silicon spacer 801 is close to that within gate 301 and within silicon substrate 303. Because the surface of silicide region 902 is raised above the original surface of silicon substrate 303, the outward expansion of silicide will result in continuous silicide layer formation at the local interconnect. Also, because the metal thickness around the intersection between silicon spacer 801 and diffusion region 601 is significantly thicker (e.g. 300 Angstroms) than the oxide, there is plenty of metal supply for silicide formation, resulting in a continuous silicide formation at the interface between silicon spacer 801 and diffusion region 601. This results in a local interconnect 910 that is robust and that makes reliable electrical connection.

Silicide 902 forms on deep-junction diffusion region 601. Thus, rough silicide formation is less likely to result in junction punch-through as compared to prior art processes. Thus, the local interconnect structure and method of the present invention does not produce junction leakage as occurs in prior art methods.

In structures that use STI for isolating diffusion areas, a good electrical connection results even when the gate 301 does not overlie the diffusion area. Thus, the local interconnect and method for forming a local interconnect of the present invention does not result in disconnection, as typically results in prior art processes from photolithography misalignment.

Thus, the present invention provides a local interconnect structure and a method for forming a local interconnect structure that produces a local interconnect that is robust and that makes good electrical connection. Also the local interconnect structure and the method for making a local interconnect structure of the present invention does not have silicidation induced junction leakage.

The local interconnect and method for forming a local interconnect of the present invention is particularly applicable to the production of Application Specific Integrated Circuit (ASIC) devices that include Static Random Access Memory (SRAM) cells. A six-transistor SRAM cell essentially consists of two CMOS inverters cross-coupled via appropriate connections between gates and diffusions. By providing a robust local interconnect for cross-coupling gates and diffusions, cell size is minimized.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. For a semiconductor substrate having a gate and a spacer and a diffusion region disposed thereon, a local interconnect comprising:

a) a layer of oxide disposed over said gate, said spacer, and said diffusion region, said layer of oxide overlying an opening in a portion of said spacer;

b) a silicon spacer overlying said layer of oxide and adjoining said gate, said silicon spacer disposed in said opening; and c) a silicide region disposed over said gate, said silicon spacer, and said diffusion region, said silicide region forming an interconnect between said gate and said diffusion region.

2. The local interconnect as recited in claim 1 wherein said layer of oxide is a thin layer of TEOS-based silicon oxide.

3. The local interconnect as recited in claim 1 wherein said layer of oxide has a thickness of approximately 30 to 50 Angstroms.

4. The local interconnect as recited in claim 2 wherein said silicon spacer comprises amorphous silicon.

5. The local interconnect as recited in claim 2 wherein said silicon spacer comprises polycrystalline silicon.

6. The local interconnect as recited in claim 1 wherein said silicide region comprises titanium silicide.

7. The local interconnect as recited in claim 1 wherein said silicide region comprises nickel silicide.

8. A structure comprising:
- a gate electrode having a first spacer and a second spacer disposed adjacent opposing sidewalls thereof;
- wherein the first spacer comprises a dielectric material; and the second spacer comprises a dielectric material having a recessed portion therein, and an L-shaped layer of dielectric material disposed in the recessed portion so as to be abutting the gate electrode; a layer of a first material overlying the L-shaped layer; and a layer of metal silicide overlying at least the first material.

9. The structure of claim 8, wherein the first material is selected from the group consisting of polysilicon and amorphous silicon, and wherein the layer of metal silicide overlies a top surface of the gate electrode.

10. The structure of claim 8, wherein the layer of metal silicide further overlies a source/drain region.

11. A local interconnect structure suitable for use in an integrated circuit, comprising:
- an electrically insulating sidewall spacer disposed adjacent a gate electrode, the sidewall spacer having a recess therein; and
- a metal silicide region disposed over a top surface of the gate electrode, disposed, at least partially, within the recess of the sidewall spacer, and disposed over a source/drain region adjacent to the sidewall spacer.

12. The local interconnect structure of claim 11, wherein the electrically insulating sidewall spacer comprises an oxide of silicon, and the metal silicide region comprises a material selected from the group consisting of titanium silicide, cobalt silicide, nickel silicide, and platinum silicide.

* * * * *